United States Patent
Zhang

(10) Patent No.: US 10,312,273 B2
(45) Date of Patent: Jun. 4, 2019

(54) LOW TEMPERATURE POLY-SILICON TFT SUBSTRATE STRUCTURE AND MANUFACTURE METHOD THEREOF

(71) Applicant: Shenzhen China Star Optoelectronics Technology Co., Ltd., Shenzhen (CN)

(72) Inventor: Xiaoxing Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/823,514

(22) Filed: Nov. 27, 2017

(65) Prior Publication Data

US 2018/0083052 A1    Mar. 22, 2018

Related U.S. Application Data

(62) Division of application No. 14/758,964, filed on Jul. 2, 2015, now Pat. No. 9,881,946.

(30) Foreign Application Priority Data

Mar. 27, 2015 (CN) .......................... 2015 1 0139978

(51) Int. Cl.
*H01L 27/12* (2006.01)
*H01L 29/786* (2006.01)
*H01L 27/32* (2006.01)

(52) U.S. Cl.
CPC ........ *H01L 27/1296* (2013.01); *H01L 27/124* (2013.01); *H01L 27/1218* (2013.01); *H01L 27/1222* (2013.01); *H01L 27/1262* (2013.01); *H01L 27/1274* (2013.01); *H01L 27/1281* (2013.01); *H01L 29/78675* (2013.01); *H01L 29/78696* (2013.01); *H01L 27/3262* (2013.01)

(58) Field of Classification Search
CPC ............. H01L 27/1296; H01L 27/1262; H01L 27/1281; H01L 27/1218; H01L 29/78696; H01L 27/1222; H01L 27/1274; H01L 27/124; H01L 29/78675; H01L 27/3262
See application file for complete search history.

(56) References Cited

U.S. PATENT DOCUMENTS

2008/0042131 A1*  2/2008  Morimoto ............... H01L 27/12
                                                              257/59
2008/0087889 A1*  4/2008  Chan ................... H01L 27/1229
                                                              257/40

* cited by examiner

*Primary Examiner* — Mohammed R Alam
(74) *Attorney, Agent, or Firm* — Leong C. Lei

(57) ABSTRACT

A method for manufacturing a LTPS TFT substrate is provided. Buffer layers are respectively provided in a drive TFT area and a display TFT area and have different thicknesses, such that the thickness of the buffer layer in the drive TFT area is larger than the thickness of the buffer layer in the display TFT area so that different temperature grades are formed in a crystallization process of poly-silicon to achieve control of the grain diameters of crystals. A poly-silicon layer that is formed in the drive TFT area in the crystallization process has a large lattice dimension to increase electron mobility thereof. Fractured crystals can be formed in a poly-silicon layer of the display TFT area in the crystallization process for ensuring the uniformity of the grain boundary and increasing the uniformity of electrical current. Accordingly, the electrical property demands for different TFTs can be satisfied.

6 Claims, 6 Drawing Sheets drive TFT area      display TFT area drive TFT area      display TFT area drive TFT area      display TFT area

LOW TEMPERATURE POLY-SILICON TFT SUBSTRATE STRUCTURE AND MANUFACTURE METHOD THEREOF

CROSS REFERENCE TO RELATED APPLICATIONS

This is a divisional application of co-pending patent application Ser. No. 14/758,964, filed on Jul. 2, 2015, which is a national stage of PCT application number PCT/CN2015/077159, filed on Apr. 22, 2015, claiming foreign priority of Chinese patent application number 201510139978.0, filed on Mar. 27, 2015.

FIELD OF THE INVENTION

The present invention relates to a display technology field, and more particularly to a low temperature poly-silicon thin film transistor (TFT) substrate structure and a manufacture method thereof.

BACKGROUND OF THE INVENTION

The low temperature poly-silicon (LTPS) technology is the manufacture technology of the new generation TFT substrate. The most significant difference from the traditional amorphous silicon (a-Si) is that the response speed of the LTPS display is faster and possesses advantages of high brightness, high resolution and low electrical power consumption. The poly-silicon (poly-Si) possesses excellent electrical property, and better drive ability to the active matrix organic light emitting diode (AMOLED). Thus, the AMOLED display back plate based on the low temperature poly-silicon technology has been widely utilized at present.

The present manufacture method of the LTPS TFT substrate mainly comprises the following steps:

Step 1, as shown in FIG. 1, providing a substrate 100, wherein the substrate 100 comprises a drive TFT area and a display TFT area, and depositing a buffer layer 110 on the substrate 100;

Step 2, as shown in FIG. 2, depositing an amorphous silicon layer on the buffer layer 110 and implementing an excimer laser annealing process to the amorphous silicon layer to make the amorphous silicon layer crystallized and converted to be a poly-silicon layer 130 after excimer laser annealing pretreatment;

Step 3, as shown in FIG. 3, patterning the poly-silicon layer 130 to obtain a first poly-silicon section 140 in the drive TFT area and a second poly-silicon section 150 in the display TFT area which are alternately spaced;

Step 4, depositing a gate isolation layer 160 on the first poly-silicon section 140, the second poly-silicon section 150 and the buffer layer 110;

Step 5, depositing and patterning a first metal layer on the gate isolation layer 160, and forming a first gate 170 and a second gate 180 respectively above the first poly-silicon section 140 and the second poly-silicon section 150 and corresponding thereto;

Step 6, depositing an interlayer insulation layer 190 on the gate isolation layer 160, the first gate 170 and the second gate 180, and forming a first via 200 and a second via 200' in the interlayer insulation layer 190 and the gate isolation layer 160 respectively above the first poly-silicon section 140 and the second poly-silicon section 150 and corresponding thereto; and Step 7, as shown in FIG. 4, depositing and patterning a second metal layer on the interlayer insulation layer 190, and respectively forming a first source/drain 210 in the drive TFT area and a second source/drain 220 in the display TFT area, and the first source/drain 210 contacts with the first poly-silicon section 140 through the first via 200, and the second source/drain 220 contacts with the second poly-silicon section 150 through the second via 200'.

In the above process, the excimer laser annealing (ELA) technology utilizes transient pulses of laser to irradiate on the surface of the amorphous silicon layer to be melted and recrystallized. The AMOLED driving requires a drive TFT and a display TFT. The drive TFT demands larger lattice and thus higher electron mobility is required. The display TFT needs efficient electron mobility and uniformity of the electrical current. Accordingly, the OLED element can uniformly illuminate.

However, the ELA crystallization technology according to prior art cannot achieve effective control to the uniformity of the lattices and the crystallization direction of the lattices. The distribution of crystallization condition in the entire substrate is extremely non-uniform and results in that the long distance of the display effect is not uniform.

SUMMARY OF THE INVENTION

An objective of the present invention is to provide a manufacture method of a low temperature poly-silicon TFT substrate structure, capable of controlling the crystallization process of the poly-silicon to make that the larger lattice dimension of the poly-silicon layer is formed in the drive TFT area in the crystallization process and raise the electron mobility. The fractured crystals of poly-silicon layer in the display TFT area can be obtained in the crystallization process for ensuring the uniformity of the grain boundary and raising the uniformity of the current. Accordingly, the electrical property demands for different TFTs can be satisfied to raise the light uniformity of the OLED.

Another objective of the present invention is to provide a low temperature poly-silicon TFT substrate structure, of which the lattice dimension of the poly-silicon layer in the drive TFT area is larger and higher electron mobility is provided. The uniformity of the grain boundary is well and the uniformity of the current is higher.

For realizing the aforesaid objectives, the present invention provides a manufacture method of a low temperature poly-silicon TFT substrate structure, which comprises the following steps:

Step 1, providing a substrate, wherein the substrate comprises a drive TFT area and a display TFT area, and depositing a buffer layer on the substrate, and patterning the buffer layer to make a thickness of the buffer layer in the drive TFT area be larger than a thickness of the buffer layer in the display TFT area;

Step 2, depositing an amorphous silicon layer on the buffer layer, implementing an excimer laser annealing process to the amorphous silicon layer to make the amorphous silicon layer crystallized and converted to a poly-silicon layer after an excimer laser annealing pretreatment, and patterning the poly-silicon layer to obtain a first poly-silicon section in the drive TFT area and a second poly-silicon section in the display TFT area;

Step 3, depositing a gate isolation layer on the first poly-silicon section, the second poly-silicon section and the buffer layer;

Step 4, depositing and patterning a first metal layer on the gate isolation layer to form a first gate and a second gate respectively above the first poly-silicon section and the second poly-silicon section and corresponding thereto;

Step 5, depositing an interlayer insulation layer on the gate isolation layer, the first gate and the second gate and forming a first via and a second via in the interlayer insulation layer and the gate isolation layer to be respectively above the first poly-silicon section and the second poly-silicon section and corresponding thereto; and Step 6, depositing and patterning a second metal layer on the interlayer insulation layer to respectively form a first source/drain in the drive TFT area and a second source/drain in the display TFT area, wherein the first source/drain contacts with the first poly-silicon section through the first via, and the second source/drain contacts with the second poly-silicon section through the second via.

A lattice dimension of the first poly-silicon section is larger than a lattice dimension of the second poly-silicon section. Fractured crystals in the second poly-silicon section outnumber fractured crystals in the first poly-silicon section.

The substrate comprises a glass substrate, and a material of the buffer layer comprises one of silicon oxide, silicon nitride, and a combination thereof.

The interlayer insulation layer is formed of a material comprising one of silicon oxide, silicon nitride, and a combination thereof.

A thickness difference between the buffer layers of the drive TFT area and the display TFT area is larger than 500 Å.

The present invention further provides a low temperature poly-silicon TFT substrate structure, which comprises a drive TFT area and a display TFT area, wherein the drive TFT area comprises a substrate, a buffer layer on the substrate, a first poly-silicon section on the buffer layer, a gate isolation layer on the buffer layer and the first poly-silicon section, a first gate on the gate isolation layer and above the first poly-silicon section and corresponding thereto, an interlayer insulation layer on the gate isolation layer and the first gate and a first source/drain on the interlayer insulation layer;

wherein the display TFT area comprises a substrate, a buffer layer on the substrate, a second poly-silicon section on the buffer layer, a gate isolation layer on the buffer layer and the second poly-silicon section, a second gate on the gate isolation layer and above the second poly-silicon section and corresponding thereto, an interlayer insulation layer on the gate isolation layer and the second gate and a second source/drain on the interlayer insulation layer; and wherein a thickness of the buffer layer in the drive TFT area is larger than a thickness of the buffer layer in the display TFT area.

A lattice dimension of the first poly-silicon section is larger than a lattice dimension of the second poly-silicon section. Fractured crystals in the second poly-silicon section outnumber fractured crystals in the first poly-silicon section.

The substrate comprises a glass substrate, and a material of the buffer layer comprises one of silicon nitride, silicon oxide, and a combination thereof. A material of the interlayer insulation layer comprises one of silicon oxide, silicon nitride, and a combination thereof.

A first via is formed in the interlayer insulation layer and the gate isolation layer in the drive TFT area and above the first poly-silicon section and corresponding thereto, and the first source/drain contacts with the first poly-silicon section through the first via; and a second via is formed in the interlayer insulation layer and the gate isolation layer in the display TFT area and above the second poly-silicon section and corresponding thereto, and the second source/drain contacts with the second poly-silicon section through the second via.

A thickness difference between the buffer layers of the drive TFT area and the display TFT area is larger than 500 Å.

The present invention further provides a low temperature poly-silicon TFT substrate structure, which comprises a drive TFT area and a display TFT area, wherein the drive TFT area comprises a substrate, a buffer layer on the substrate, a first poly-silicon section on the buffer layer, a gate isolation layer on the buffer layer and the first poly-silicon section, a first gate on the gate isolation layer and above the first poly-silicon section and corresponding thereto, an interlayer insulation layer on the gate isolation layer and the first gate and a first source/drain on the interlayer insulation layer;

wherein the display TFT area comprises a substrate, a buffer layer on the substrate, a second poly-silicon section on the buffer layer, a gate isolation layer on the buffer layer and the second poly-silicon section, a second gate on the gate isolation layer and above the second poly-silicon section and corresponding thereto, an interlayer insulation layer on the gate isolation layer and the second gate and a second source/drain on the interlayer insulation layer;

wherein a thickness of the buffer layer in the drive TFT area is larger than a thickness of the buffer layer in the display TFT area;

wherein a lattice dimension of the first poly-silicon section is larger than a lattice dimension of the second poly-silicon section; and fractured crystals in the second poly-silicon section outnumber fractured crystals in the first poly-silicon section;

wherein the substrate comprises a glass substrate; a material of the buffer layer comprises one of silicon nitride, silicon oxide, and a combination thereof; and a material of the interlayer insulation layer comprises one of silicon oxide, silicon nitride, and a combination thereof.

The benefits of the present invention are that the present invention provides a low temperature poly-silicon TFT substrate structure and a manufacture method thereof. By providing the buffer layers in the drive TFT area and the display TFT area with different thicknesses, wherein the thickness of the buffer layer in the drive TFT area is larger and the thickness of the buffer layer in the display TFT area is smaller, different temperature grades are formed in a crystallization process of poly-silicon to achieve control of the grain diameters of crystals. The poly-silicon layer with larger lattice dimension is formed in the drive TFT area in the crystallization process to raise the electron mobility. The fractured crystals of poly-silicon layer in the display TFT area can be obtained in the crystallization process for ensuring the uniformity of the grain boundary and raising the uniformity of the current. Accordingly, the electrical property demands for different TFTs can be satisfied to raise the light uniformity of the OLED.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
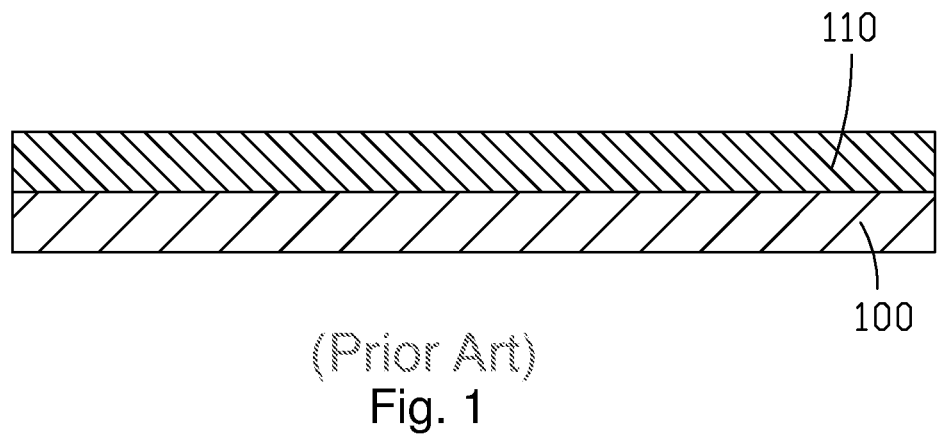
FIG. 1 is a diagram of Step 1 of a known manufacture method of a low temperature poly-silicon TFT substrate structure.
Figure 2:
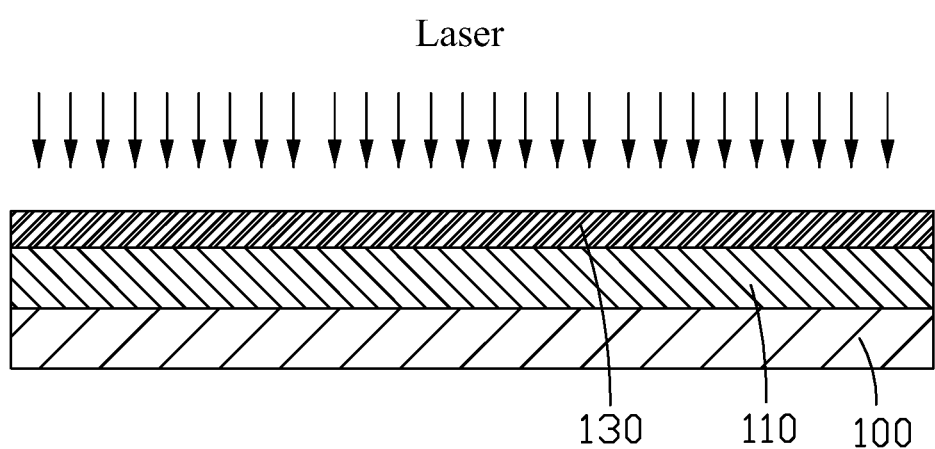
FIG. 2 is a diagram of Step 2 of the known manufacture method of a low temperature poly-silicon TFT substrate structure.
Figure 3:
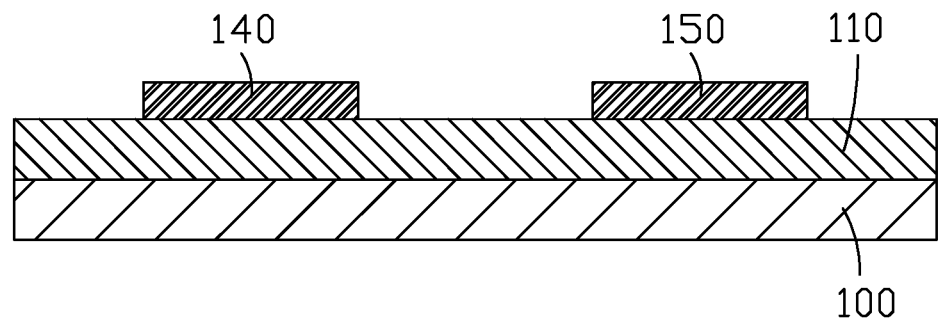
FIG. 3 is a diagram of Step 3 of the known manufacture method of a low temperature poly-silicon TFT substrate structure.
Figure 4:
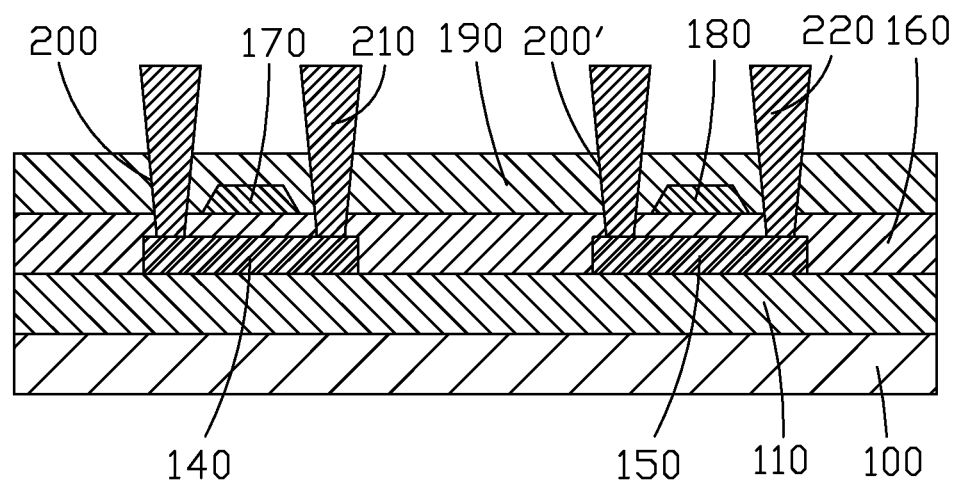
FIG. 4 is a diagram of Step 7 of the known manufacture method of a low temperature poly-silicon TFT substrate structure.
Figure 5:
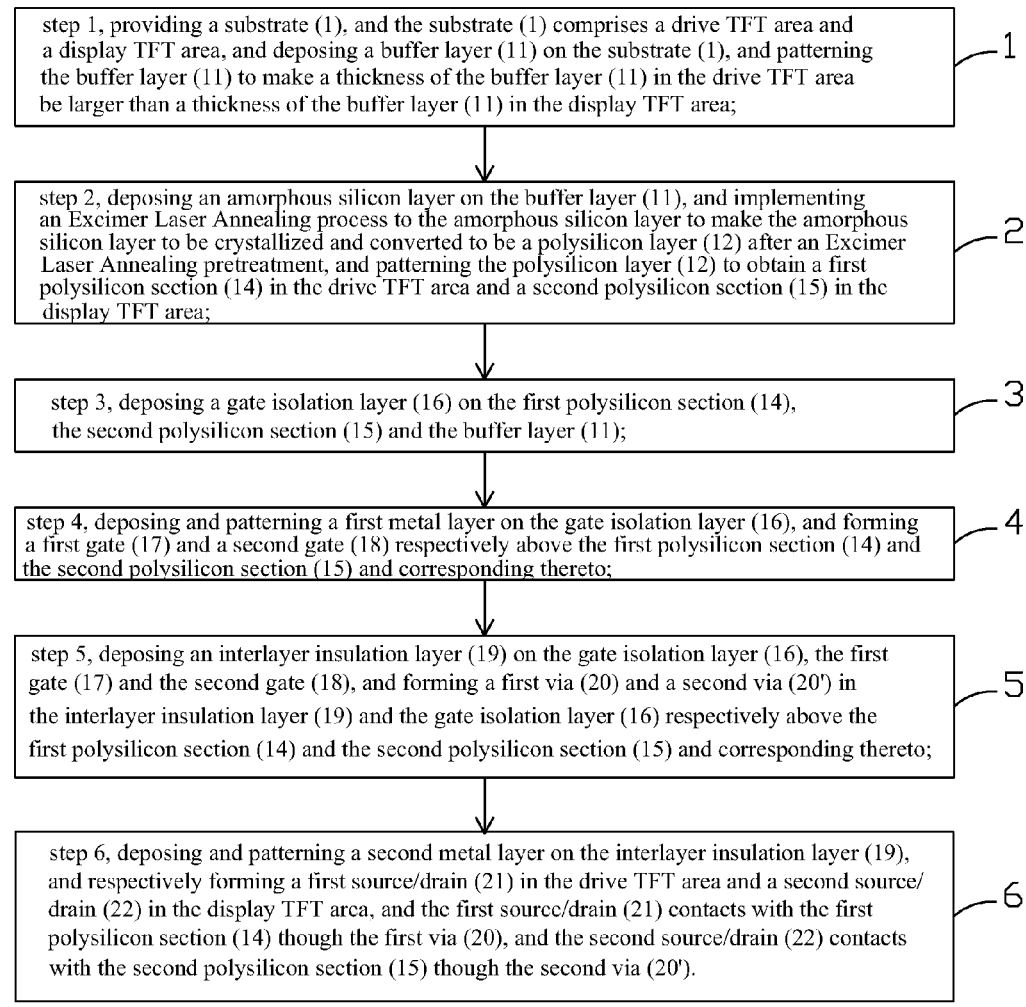
FIG. 5 is a flowchart of a manufacture method of a low temperature poly-silicon TFT substrate structure according to the present invention.
Figure 6:
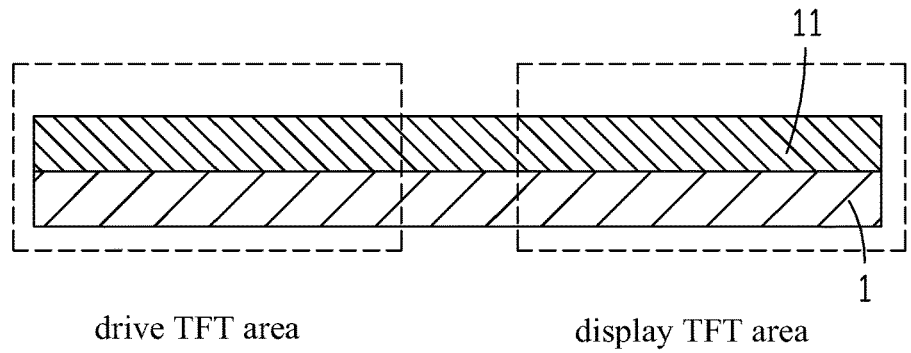
FIGS. 6-7 are diagrams of Step 1 of the manufacture method of a low temperature poly-silicon TFT substrate structure according to the present invention.
Figure 7:
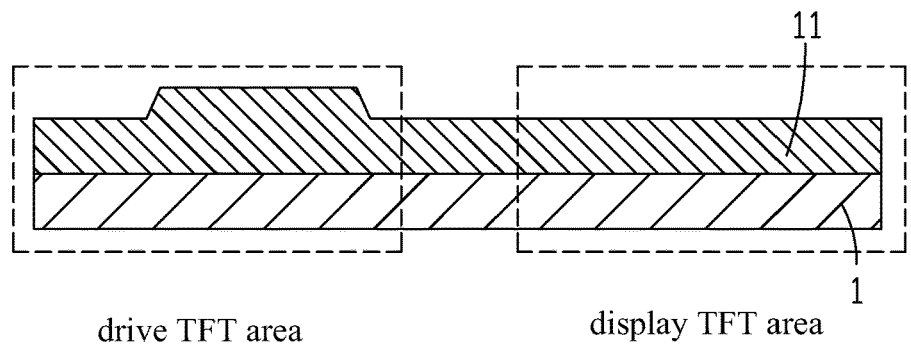

Referring to FIG. 5, the present invention first provides a manufacture method of a low temperature poly-silicon TFT substrate structure, which comprises the following steps:

Step 1, as shown in FIGS. 6-7, providing a substrate 1, wherein the substrate 1 comprises a drive TFT area and a display TFT area, depositing a buffer layer 11 on the substrate 1, and patterning the buffer layer 11 to make a thickness of the buffer layer 11 in the drive TFT area larger than a thickness of the buffer layer 11 in the display TFT area.

Specifically, the substrate 1 is a glass substrate, and a material of the buffer layer 11 is silicon oxide (SiOx), silicon nitride (SiNx), or a combination thereof.

By providing the buffer layers 11 in the drive TFT area and the display TFT area with different thicknesses, different temperature grades are formed in a crystallization process of the poly-silicon so as to achieve control of the grain diameters of crystals.

Preferably, a thickness difference between the buffer layer 11 of the drive TFT area and the buffer layer 11 of the display TFT area is larger than 500 Å.

Figure 8:
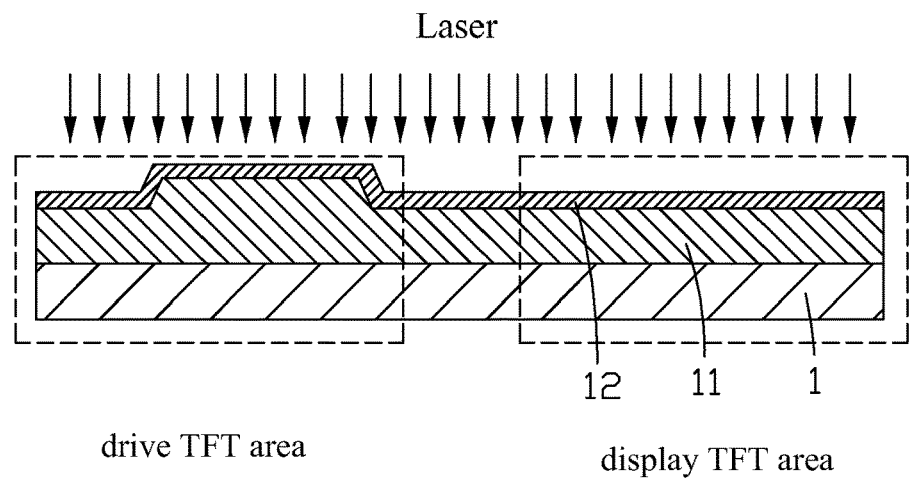
FIGS. 8-9 are diagrams of Step 2 of the manufacture method of a low temperature poly-silicon TFT substrate structure according to the present invention.
Figure 9:
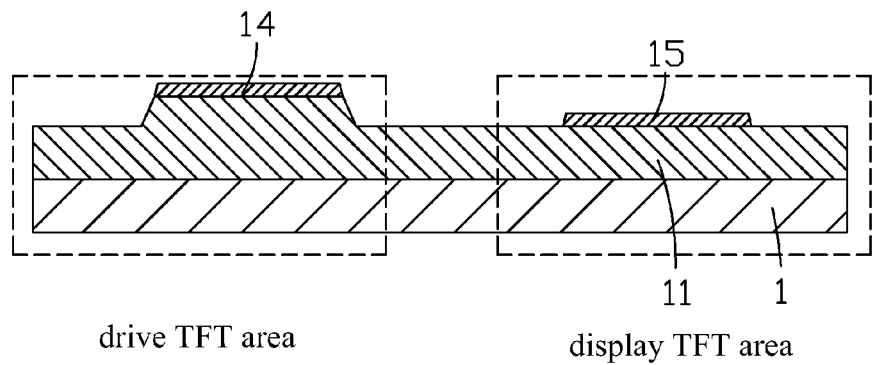

Step 2, as shown in FIGS. 8-9, depositing an amorphous silicon layer on the buffer layer 11p; implementing an excimer laser annealing process to the amorphous silicon layer to make the amorphous silicon layer crystallized and converted to a poly-silicon layer 12 after excimer laser annealing pretreatment, and patterning the poly-silicon layer 12 to obtain a first poly-silicon section 14 in the drive TFT area and a second poly-silicon section 15 in the display TFT area.

In the excimer laser annealing process, the thicker buffer layer 11 in the drive TFT area can form a better insulating course. The temperature of the poly-silicon is higher, and the fusion is complete. The insulating effect of the thinner buffer layer 11 in the display area is next. The temperature of the poly-silicon is lower, and the fusion is incomplete. Thus, different temperature grades are formed in the crystallization process of the poly-silicon to achieve the control to the grain diameters of the crystals. The poly-silicon layer with larger lattice dimension is formed in the drive TFT area in the crystallization process to raise the electron mobility. The fractured crystals of poly-silicon layer in the display TFT area can be obtained in the crystallization process for ensuring the uniformity of the grain boundary and raising the uniformity of the current. Accordingly, the electrical property demands for different TFTs can be satisfied to raise the light uniformity of the OLED.

Therefore, in this embodiment, a lattice dimension of the first poly-silicon section 14 is larger than a lattice dimension of the second poly-silicon section 15; fractured crystals in the second poly-silicon section 15 are more than fractured crystals in the first poly-silicon section 14.

Figure 10:
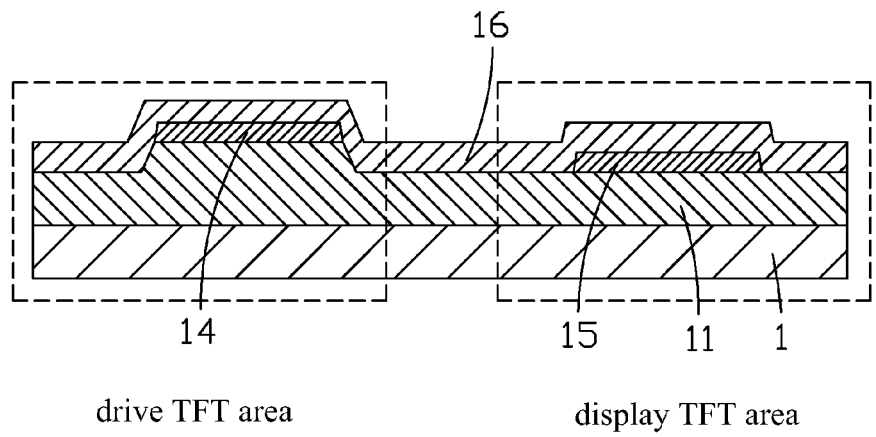
FIG. 10 is a diagram of Step 3 of the manufacture method of a low temperature poly-silicon TFT substrate structure according to the present invention.

Step 3, as shown in FIG. 10, depositing a gate isolation layer 16 on the first poly-silicon section 14, the second poly-silicon section 15 and the buffer layer 11.

Figure 11:
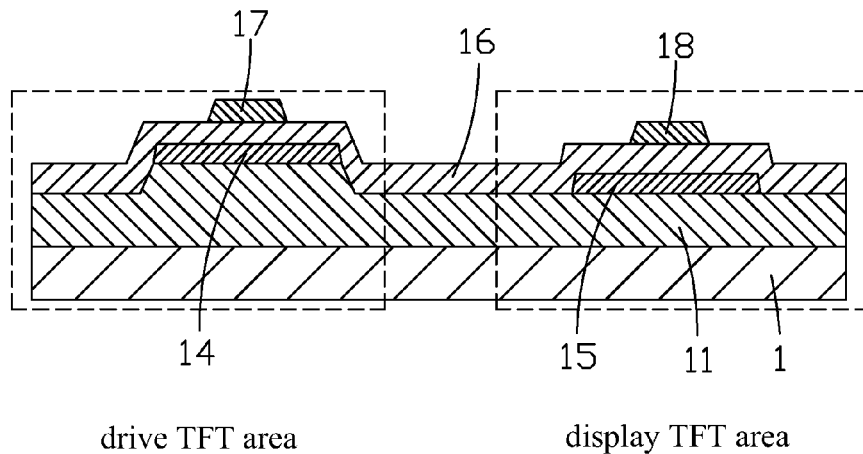
FIG. 11 is a diagram of Step 4 of the manufacture method of a low temperature poly-silicon TFT substrate structure according to the present invention.

Step 4, as shown in FIG. 11, depositing and patterning a first metal layer on the gate isolation layer 16, and forming a first gate 17 and a second gate 18 respectively above the first poly-silicon section 14 and the second poly-silicon section 15 and corresponding thereto.

Figure 12:
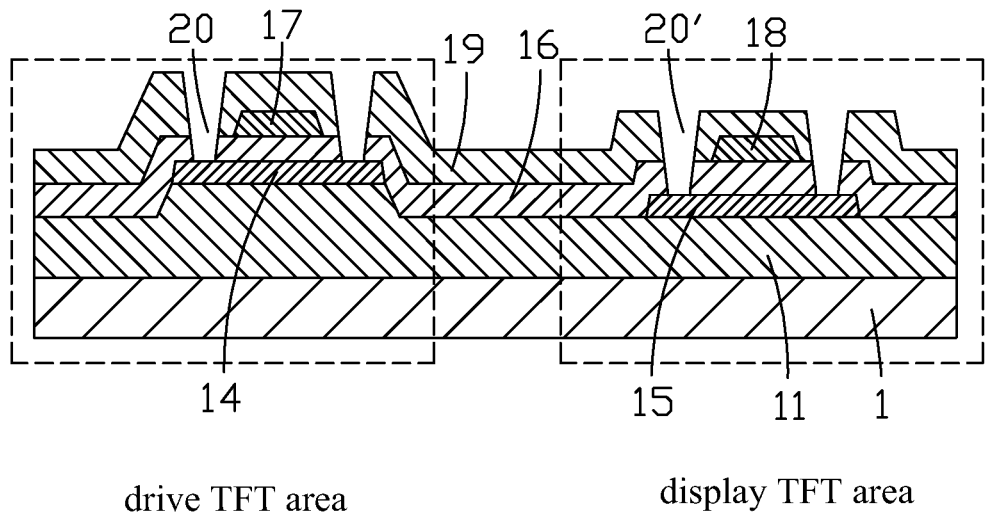
FIG. 12 is a diagram of Step 5 of the manufacture method of a low temperature poly-silicon TFT substrate structure according to the present invention.

Step 5, as shown in FIG. 12, depositing an interlayer insulation layer 19 on the gate isolation layer 16, the first gate 17 and the second gate 18, and forming a first via 20 and a second via 20' in the interlayer insulation layer 19 and the gate isolation layer 16 respectively above the first poly-silicon section 14 and the second poly-silicon section 15 and corresponding thereto.

Specifically, a material of the interlayer insulation layer 19 is silicon oxide, silicon nitride, or a combination thereof.

Figure 13:
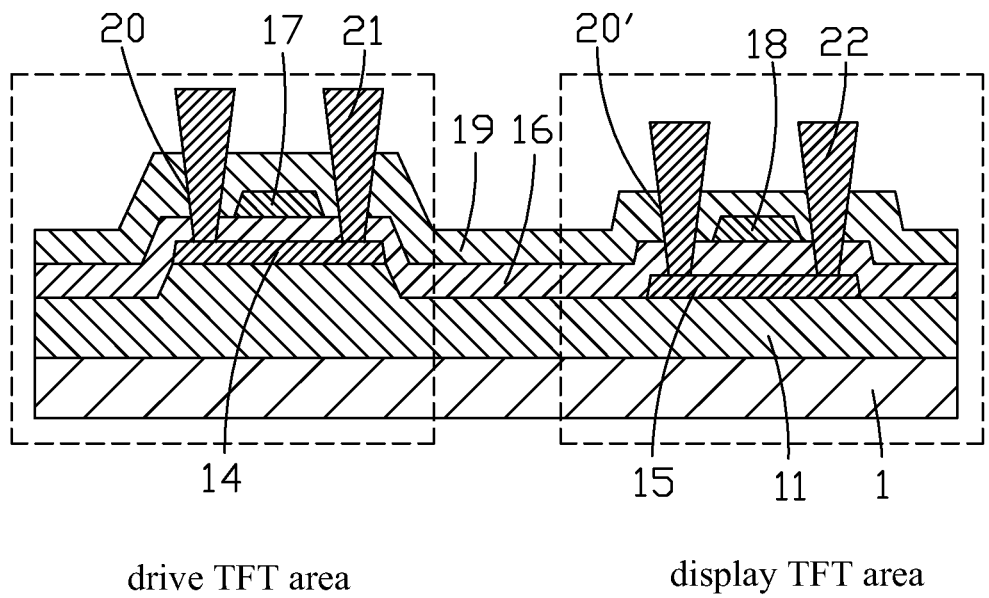
FIG. 13 is a diagram of Step 6 of the manufacture method of a low temperature poly-silicon TFT substrate structure according to the present invention and is also a sectional diagram of a low temperature poly-silicon TFT substrate structure according to the present invention.

Step 6, as shown in FIG. 13, depositing and patterning a second metal layer on the interlayer insulation layer 19 to respectively form a first source/drain 21 in the drive TFT area and a second source/drain 22 in the display TFT area, wherein the first source/drain 21 contacts with the first poly-silicon section 14 through the first via 20 and the second source/drain 22 contacts with the second poly-silicon section 15 through the second via 20'.

The aforesaid manufacture method of the low temperature poly-silicon TFT substrate structure provides the buffer layers in the drive TFT area and the display TFT area with different thicknesses, wherein the thickness of the buffer layer in the drive TFT area is larger and the thickness of the buffer layer in the display TFT area is smaller. Thus, different temperature grades are formed in the crystallization process of the poly-silicon to achieve control of the grain diameters of crystals. The poly-silicon layer with larger lattice dimension is formed in the drive TFT area in the crystallization process to raise the electron mobility. The fractured crystals of poly-silicon layer in the display TFT area can be obtained in the crystallization process for ensuring the uniformity of the grain boundary and raising the uniformity of the current. Accordingly, the electrical property demands for different TFTs can be satisfied to raise the light uniformity of the OLED.

Referring to FIG. 13, the present invention further provides a low temperature poly-silicon TFT substrate structure, which comprises a drive TFT area and a display TFT area. The drive TFT area comprises a substrate 1, a buffer layer 11 on the substrate 1, a first poly-silicon section 14 on the buffer layer 11, a gate isolation layer 16 on the buffer layer 11 and the first poly-silicon section 14, a first gate 17 on the gate isolation layer 16 and above the first poly-silicon section 14 and corresponding thereto, an interlayer insulation layer 19 on the gate isolation layer 16 and the first gate 17 and a first source/drain 21 on the interlayer insulation layer 19.

The display TFT area comprises a substrate 1, a buffer layer 11 on the substrate 1, a second poly-silicon section 15 on the buffer layer 11, a gate isolation layer 16 on the buffer layer 11 and the second poly-silicon section 15, a second gate 18 on the gate isolation layer 16 and above the second poly-silicon section 15 and corresponding thereto, an interlayer insulation layer 19 on the gate isolation layer 16 and the second gate 18 and a second source/drain 22 on the interlayer insulation layer 19.

A thickness of the buffer layer 11 in the drive TFT area is larger than a thickness of the buffer layer 11 in the display TFT area.

A lattice dimension of the first poly-silicon section 14 is larger than a lattice dimension of the second poly-silicon section 15; fractured crystals in the second poly-silicon section 15 are more than fractured crystals in the first poly-silicon section 14.

Specifically, a first via 20 is formed in the interlayer insulation layer 19 and the gate isolation layer 16 in the drive TFT area and above the first poly-silicon section 14 and corresponding thereto, and the first source/drain 21 contacts with the first poly-silicon section 14 through the first via 20.

A second via 20' is formed in the interlayer insulation layer 19 and the gate isolation layer 16 in the display TFT area and above the second poly-silicon section 15 and corresponding thereto, and the second source/drain 22 contacts with the second poly-silicon section 15 through the second via 20'.

Specifically, the substrate 1 is a glass substrate.

Specifically, a material of the buffer layer 11 is silicon nitride, silicon oxide, or a combination thereof; and a material of the interlayer insulation layer 19 is silicon oxide, silicon nitride or a combination thereof.

Preferably, a thickness difference between the buffer layer 11 of the drive TFT area and the buffer layer 11 of the display TFT area is larger than 500 Å.

In the aforesaid low temperature poly-silicon TFT substrate structure, the buffer layers in the drive TFT area and the display TFT area have different thicknesses, wherein the thickness of the buffer layer in the drive TFT area is larger and the thickness of the buffer layer in the display TFT area is smaller. Different temperature grades are formed in the crystallization process of the poly-silicon. The poly-silicon layer with larger lattice dimension is formed in the drive TFT area in the crystallization process to raise the electron mobility. The uniformity of the grain boundary of the poly-silicon layer in the display TFT area is better in the crystallization process. The uniformity of the current is better. The electrical property demands for different TFTs can be satisfied to raise the light uniformity of the OLED.

In summary, the low temperature poly-silicon TFT substrate structure and the manufacture method thereof according to the present invention provides the buffer layers in the drive TFT area and the display TFT area with different thicknesses, wherein the thickness of the buffer layer in the drive TFT area is larger and the thickness of the buffer layer in the display TFT area is smaller. Different temperature grades are formed in the crystallization process of the poly-silicon to achieve control of the grain diameters of crystals. The poly-silicon layer with larger lattice dimension is formed in the drive TFT area in the crystallization process to raise the electron mobility. The fractured crystals of poly-silicon layer in the display TFT area can be obtained in the crystallization process for ensuring the uniformity of the grain boundary and raising the uniformity of the current. Accordingly, the electrical property demands for different TFTs can be satisfied to raise the light uniformity of the OLED.

The above provide only specific embodiments of the present invention. The scope of the present invention is not limited to these embodiments. For those skilled in the art, change or replacement which is easily derived should be covered by the protected scope of the invention. Thus, the protected scope of the invention should go by the subject claims.

What is claimed is:

1. A method for manufacturing a low temperature poly-silicon thin film transistor (TFT) substrate structure, comprising the following steps:

Step 1, providing a substrate, wherein the substrate comprises a drive TFT area and a display TFT area, depositing a buffer layer on the substrate, and patterning the buffer layer to make a thickness of the buffer layer in the drive TFT area larger than a thickness of the buffer layer in the display TFT area, wherein the buffer layer of the drive TFT area and the buffer layer of the display TFT area are formed of the same material such that a thickness of the material of the buffer layer in the drive TFT area is larger than a thickness of the material of the buffer layer in the display TFT area by a predetermined buffer layer thickness difference;

Step 2, depositing an amorphous silicon layer on the buffer layer, implementing an excimer laser annealing process to the amorphous silicon layer to make the amorphous silicon layer crystallized and converted to a poly-silicon layer, and patterning the poly-silicon layer to obtain a first poly-silicon section in the drive TFT area and a second poly-silicon section in the display TFT area;

Step 3, depositing a gate isolation layer on the first poly-silicon section, the second poly-silicon section and the buffer layer;

Step 4, depositing and patterning a first metal layer on the gate isolation layer to form a first gate and a second gate respectively above the first poly-silicon section and the second poly-silicon section and corresponding thereto;

Step 5, depositing an interlayer insulation layer on the gate isolation layer, the first gate and the second gate and forming a first via and a second via in the interlayer insulation layer and the gate isolation layer to be respectively above the first poly-silicon section and the second poly-silicon section and corresponding thereto; and Step 6, depositing and patterning a second metal layer on the interlayer insulation layer to respectively form a first source/drain in the drive TFT area and a second source/drain in the display TFT area, wherein the first source/drain contacts with the first poly-silicon section through the first via and the second source/drain contacts with the second poly-silicon section through the second via.

2. The method as claimed in claim 1, wherein a lattice dimension of the first poly-silicon section is larger than a lattice dimension of the second poly-silicon section and fractured crystals in the second poly-silicon section outnumber fractured crystals in the first poly-silicon section.

3. The method as claimed in claim 1, wherein the substrate comprises a glass substrate.

4. The method as claimed in claim 1, wherein the material of the buffer layer is one of silicon oxide, silicon nitride, and a combination thereof.

5. The method as claimed in claim 1, wherein the interlayer insulation layer is formed of a material comprising one of silicon oxide, silicon nitride, and a combination thereof.

6. The method as claimed in claim 1, wherein the predetermined buffer layer thickness difference is larger than 500 Å.

* * * * *